US005942900A

United States Patent [19]

DeMeerleer et al.

[11] Patent Number: 5,942,900

[45] Date of Patent: Aug. 24, 1999

[54] METHOD OF FAULT DETECTION IN INK JET PRINTHEAD HEATER CHIPS

[75] Inventors: Jan Richard DeMeerleer, Lexington; George Keith Parish, Winchester; Lawrence Russell Steward, Lexington; Robert Shelby Tucker, Paris, all of Ky.

[73] Assignee: Lexmark International, Inc., Lexington, Ky.

[21] Appl. No.: 08/767,922

[22] Filed: Dec. 17, 1996

[51] Int. Cl.$^{6}$ .......... G01R 27/56

[52] U.S. Cl. .......... 324/537; 324/765

[58] Field of Search .......... 324/537, 522, 324/765; 347/19; 361/212

[56] References Cited

U.S. PATENT DOCUMENTS

| | | | |
|---|---|---|---|
| 3,048,776 | 8/1962 | Logan | 324/64 |
| 3,728,616 | 4/1973 | Cheek et al. | 324/51 |
| 4,144,493 | 3/1979 | Lee et al. | 324/158 R |
| 4,206,541 | 6/1980 | Marciniec | 29/611 |
| 4,516,071 | 5/1985 | Buehler | 324/158 R |
| 4,714,917 | 12/1987 | Counter et al. | 340/679 |
| 4,835,466 | 5/1989 | Maly et al. | 324/158 R |
| 5,051,690 | 9/1991 | Maly et al. | 324/158 R |
| 5,164,747 | 11/1992 | Osada et al. | 346/140 R |
| 5,262,666 | 11/1993 | Yoshino et al. | 257/427 |
| 5,287,072 | 2/1994 | Kojima et al. | 330/307 |
| 5,332,973 | 7/1994 | Brown et al. | 324/537 |
| 5,363,134 | 11/1994 | Barbehenn et al. | 347/49 |
| 5,440,234 | 8/1995 | Kondo | 324/526 |
| 5,504,507 | 4/1996 | Watrobski | 347/19 |
| 5,532,901 | 7/1996 | Hawkins | 361/212 |
| 5,710,689 | 1/1998 | Becerra | 361/57 |
| 5,736,997 | 4/1998 | Bolash | 347/19 |

*Primary Examiner*—Maura Regan
*Attorney, Agent, or Firm*—John J. McArdle; Ronald K. Aust

[57] ABSTRACT

Method and apparatus is described for detecting faults, such as cracks, in ink jet printhead heater chips using a resistor on the heater chip. The resistor is located adjacent to at least one edge of the heater chip. One method, for example, includes the steps of measuring the resistance of the resistor at a first temperature and comparing the measured electrical resistance to a theoretical calculated resistance. Another method, for example, includes the steps of measuring the resistance at a first temperature, heating the chip, and measuring the resistance at a second temperature. Faults are detected by comparing expected changes in resistance or temperature to measured changes.

10 Claims, 4 Drawing Sheets

METHOD OF FAULT DETECTION IN INK JET PRINTHEAD HEATER CHIPS

TECHNICAL FIELD

This invention pertains to a method of detecting faults in ink jet printhead heater chips. Particularly, the invention relates to a method of detecting faults by measuring the resistance of a resistor located around the periphery of a printhead heater chip.

BACKGROUND

In a thermal ink jet printhead, printhead heater chips carry the heating elements that provide heat to the ink, thereby creating the bubble of ink that ultimately prints on a receiving surface, such as paper. During the manufacturing of ink jet printheads, printhead heater chips can be damaged. Faults, such as cracks and fractures, many of which are not readily detectable, can be introduced. Minor faults can further propagate during shipping and operation, causing the printheads to fail prematurely, resulting in customer dissatisfaction.

It is desirable to have a method of detecting faults that is relatively simple and inexpensive. Preferably, such a method can be incorporated in the manufacturing cycle such that testing for faults can occur before manufacture of the printhead is completed.

The method of the present invention provides for an easy and low cost method of testing for faults in printhead heater chips. The method utilizes the incorporation of a simple resistor adjacent to any edge of the heater chip where a fault may occur. It does not require the addition of complicated electronic components to the printhead heater chip.

SUMMARY OF THE INVENTION

The invention is directed to apparatus and method for detecting faults in a printhead heater chip. One such method includes the steps of forming said printhead heater chip such that a resistor is adjacent to at least one edge of said chip; measuring the electrical resistance of the resistor at a first temperature; and, comparing measured electrical resistance to a theoretical calculated resistance, wherein a result of the comparing step represents the absence or presence of a fault in the printhead heater chip.

For example, if the measured electrical resistance is not substantially equal to he theoretical calculated resistance, then the heater chip is considered to be faulty. If, however, the measured electrical resistance is substantially equal to the theoretical calculated resistance, then the heater chip is considered to be substantially free of faults.

The invention further provides a method of detecting faults in a printhead heater chip including the steps of forming the printhead heater chip such that a resistor is adjacent to at least one edge of said chip; measuring a first electrical resistance of the resistor at a first temperature; heating the heater chip to a second temperature; measuring a second electrical resistance of the resistor at the second temperature; calculating an expected temperature change according to the formula: Temp. Change=$[R_2/R_1-1]/\alpha$, wherein $R_2$ is the electrical resistance at the second temperature, $R_1$ is the electrical resistance at the first temperature, and $\alpha$ is the thermal resistivity coefficient of the resistor; determining a measured temperature change between the first and second temperatures; and comparing the measured temperature change to the expected temperature change.

For example, if the measured temperature change is not substantially equal to the expected temperature change, the heater chip is considered faulty. If, however, the measured temperature change is substantially equal to the expected temperature change, the heater chip is considered to be substantially free of faults.

Other features and advantages of the invention may be realized from the drawings and detailed description of the invention that follows.

DETAILED DESCRIPTION OF THE PREFERRED EMBODIMENTS

Figure 1:
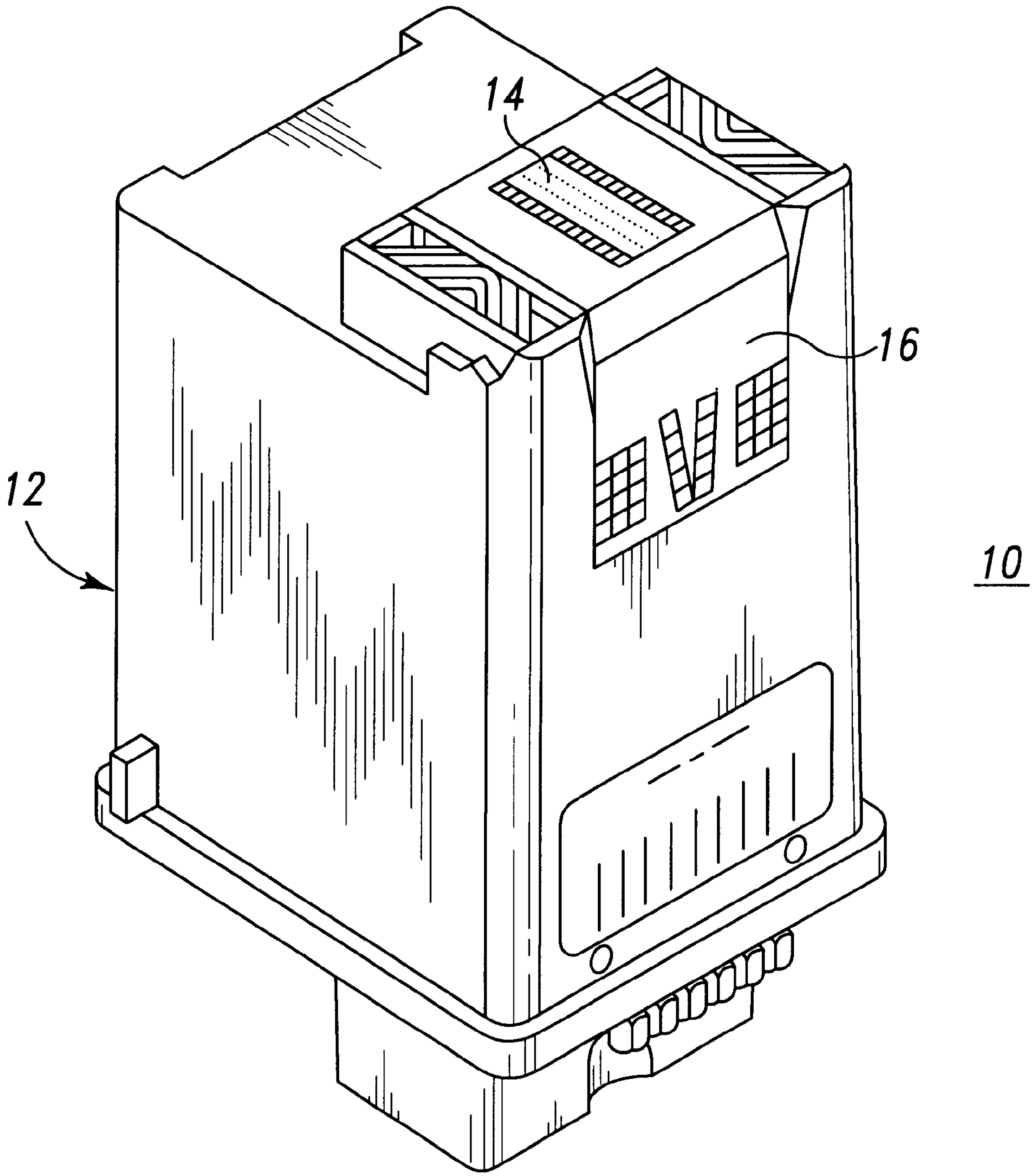
FIG. 1 is a perspective view of an ink jet printhead.

Typically, as shown in FIG. 1, a thermal ink jet printhead 10 comprises a bottle 12, a nozzle plate 14 and a TAB (tape automated bonding) circuit 16 that controls the heating elements of the heater chip 40 (not shown in FIG. 1), typically located under the nozzle plate 14. When activated, the heating elements heat the ink, causing a bubble of ink that is expelled through a nozzle on the nozzle plate 14.

Figure 2:
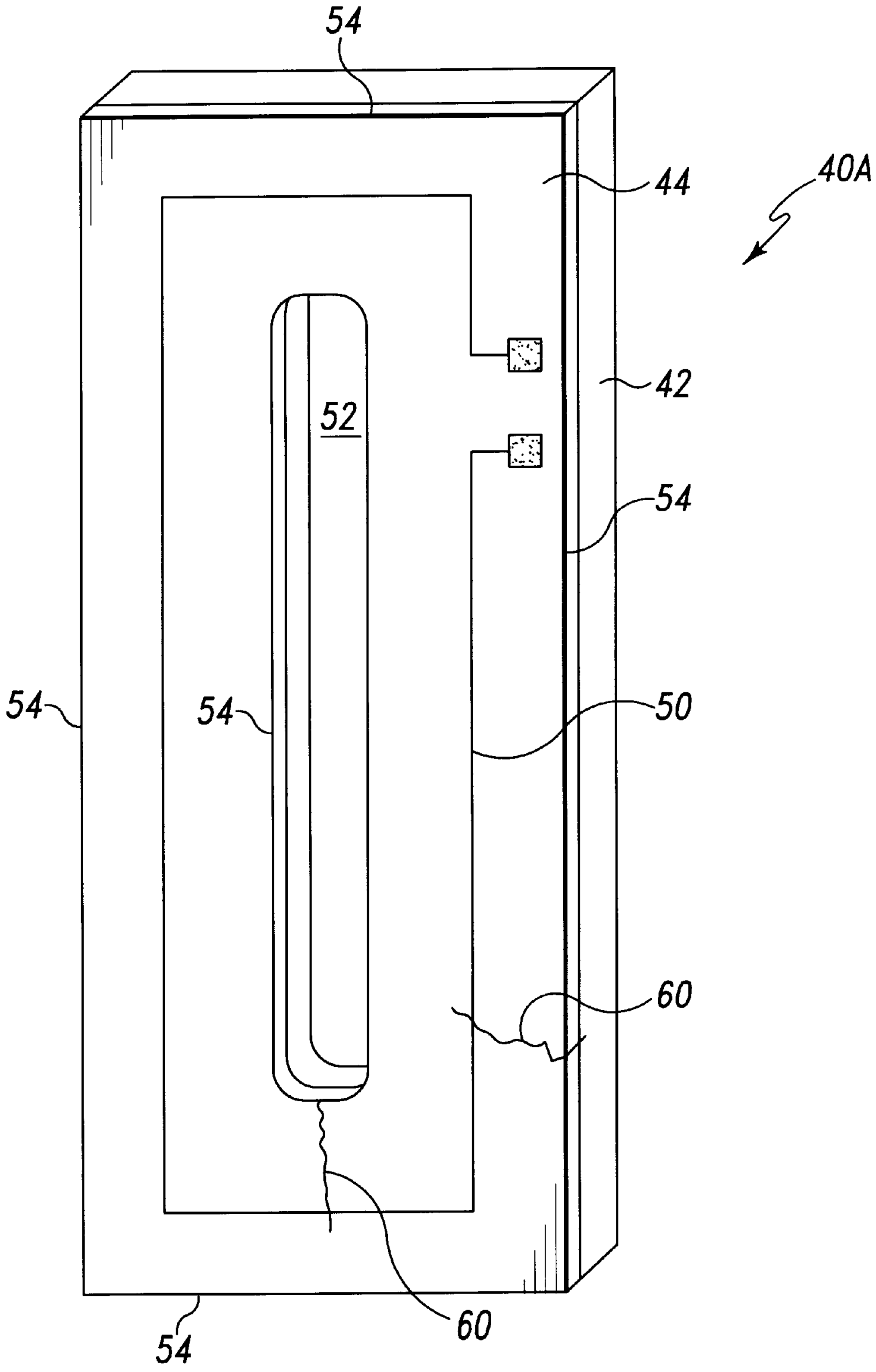
FIG. 2 is a diagrammatic perspective view of a resistor on a heater chip with one ink via.
Figure 3:
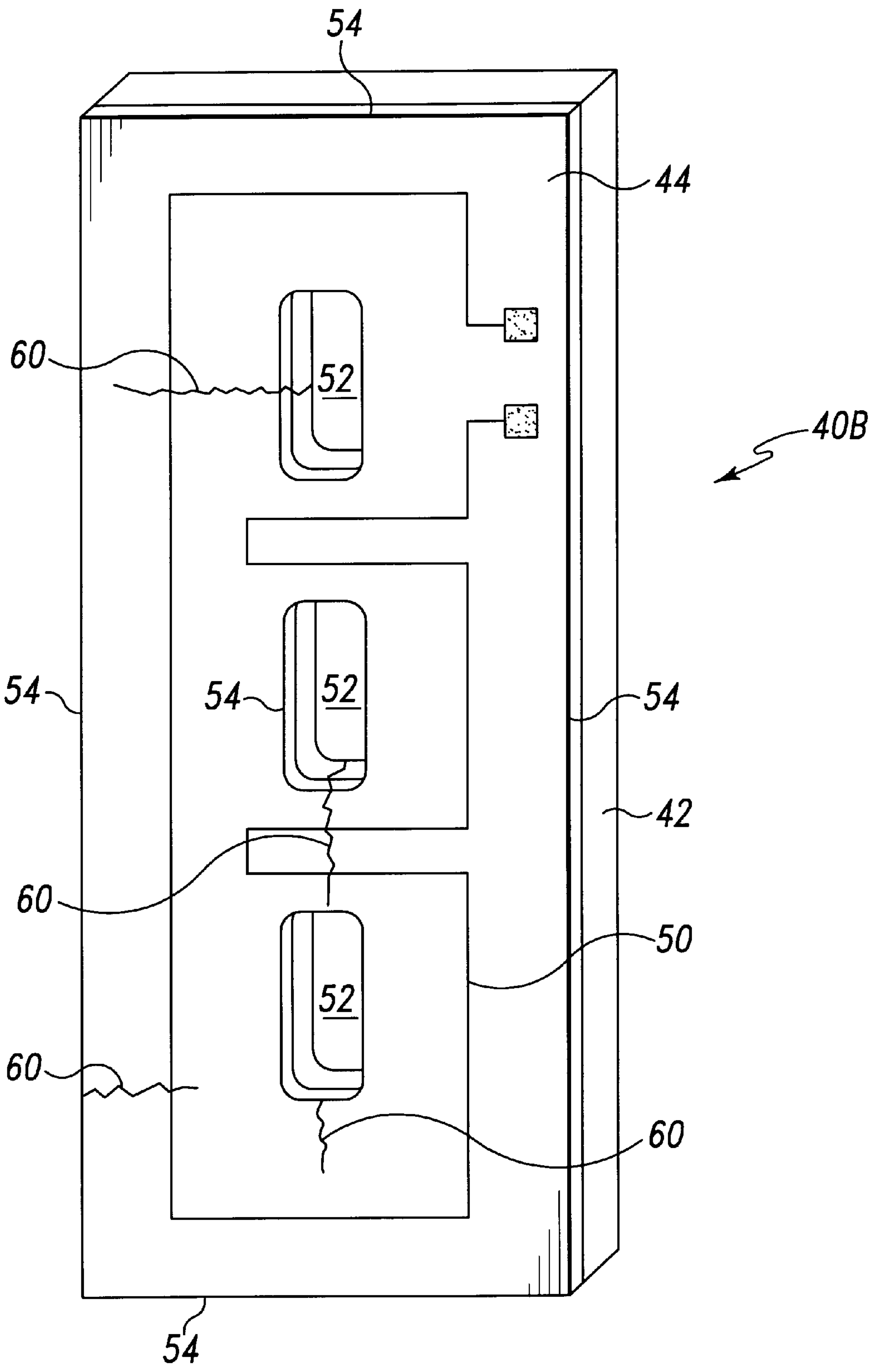
FIG. 3 is a diagrammatic perspective view of a resistor on a heater chip with more than one ink via.
Figure 4:
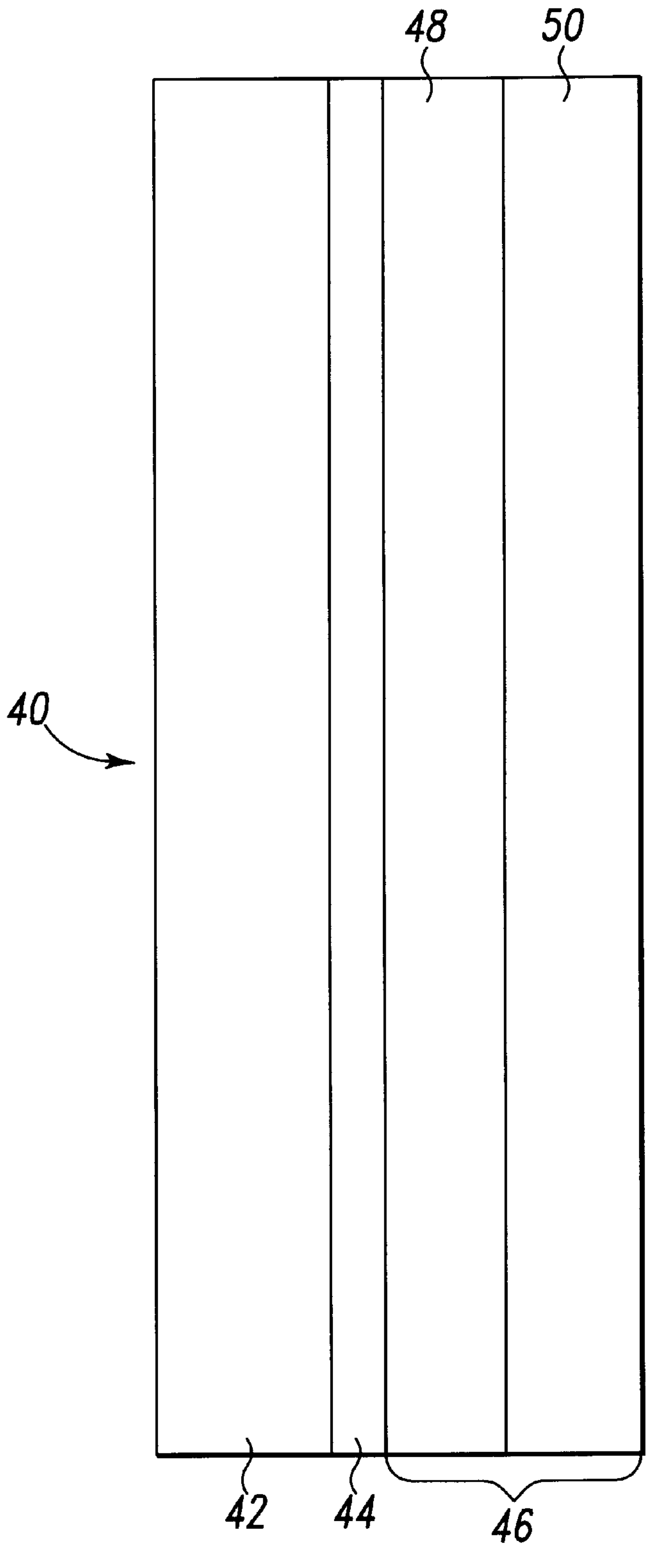
FIG. 4 is a diagrammatic side view of a heater chip.

FIGS. 2 and 3 show heater chips 40A and 40B, respectively, which are sometimes individually or collectively referred to as chip 40, each of which include circuitry used in practicing the method of the present invention. As shown in FIGS. 2–4, heater chip 40 includes a substrate 42 that is typically a silicon chip. Silicon chips are manufactured from silicon wafers that are subsequently diced into individual heater chips. A passivation layer 44 is generally applied to one surface of the substrate 42. The passivation layer 44 provides a flat receiving surface for the resistor(s) that is applied to it. Preferably, the passivation layer 44 comprises an oxide. More preferably, the passivation layer 44 comprises $SiO_2$ or silicon glass.

For use in the present invention, a temperature sensing resistor 50, preferably a thin film resistor, is applied over the passivation layer 44. Any materials known in the art for use as thin film resistors can be utilized as the temperature sensing resistor 50 in the method of this invention. Most metals have acceptable thermal properties for the temperature sensing thin film resistor. Preferably, the temperature sensing resistor 50 has a temperature coefficient of resistance less than $3\times10^{-3}$° C.$^{-1}$.

As shown in FIG. 4, preferably, the temperature sensing resistor 50 is part of a combination thin film resistor 46 having a high resistance layer 48, which is applied to the passivation layer 44, and a lower resistance layer, the temperature sensing thin film resistor 50, which is applied to the high resistance layer 48. The high resistance layer 48 is not necessary for the operation of the temperature sensing resistor 50. Rather, if a high resistance layer 48 is to be used to heat the chip 40, it is a more efficient use of the available space on the heater chip 40 to have the temperature sensing resistance layer 50 overlay the high resistance layer 48.

The high resistance layer 48 must exhibit sufficient resistance so that it functions as a heater. Typical resistance across the entire heater chip 40 is approximately 30 ohms/square. Preferably, the high resistance layer 48 comprises TaAl or $HfB_2$. The low resistance, temperature sensing thin film resistor 50 must be able to act as a conductor. Typical resistance for the temperature sensing thin film resistor 50 across the entire heater chip 40 is approximately 0.05 ohms/square. Preferably, the low resistance layer 50 comprises AlCu or AlCuSi.

Typically, thin film resistors 48 and 50 are applied by sputter coating. However, there is no limit on the method of applying the resistors 48 and 50 to the heater chip 40.

In addition to the resistors 48 and 50, heater chips 40 can include other components, such as, but not limited to, flow channels. Flow channels direct the ink flow from the ink chambers toward the nozzles. Such channels can be made by different methods, including etching into a thick film that has been applied over the resistors 48 and 50.

Referring to FIGS. 2 and 3, at least one ink via 52 may be cut into the heater chip 40, wherein FIG. 2 shows chip 40A having a single via 52, and FIG. 3 shows chip 40B having three ink vias 52. The ink via(s) 52 allows the flow of ink from the ink chamber to the nozzles. The ink via(s) 52 can be cut into the heater chip 40 by any method, including grit blasting, laser etch, chemical etch or micromachining.

To employ the method of the present invention, a printhead heater chip 40 with a resistor 50 is manufactured by conventional methods. Other components may also be incorporated on the heater chip 40, either before or after application of the resistor 50. The resistor 50 should be located on the heater chip 40 so as to maximize its ability to detect faults 60. Faults 60 can include cracks, even hairline cracks, and fractures. Faults 60 are more likely to occur on or near an edge 54 of the heater chip 40. Therefore, the resistor 50 should be located adjacent to at least one edge 54 of the heater chip 40. An edge 54 is defined as any boundary where the surface of the heater chip substrate 42 ends. Edges 54 are not limited to only the outer perimeter of the heater chip 40. Preferably, the resistor 50 is located as near as possible to more than one edge 54 of the heater chip 40. More preferably, the resistor 50 is located around the entire outside edge 54, or perimeter, of the chip. Resistor 50 near the outer edge 54 will detect faults 60 that occur during dicing of the silicon chip into individual heater chips 40, while resistors near the edges 54 of ink vias 52 will detect faults 60 that occur during ink via 52 fabrication.

If the heater chip 40 has at least one ink via 52 or other feature that is likely to introduce a fault 60 into the heater chip 40, for example, because it penetrates the surface of the heater chip substrate 42, it is preferable that, in addition to the resistor 50 adjacent to at least one edge 54 of the chip, the resistor 50 also be adjacent to the ink via 52 or other feature. If there is one ink via 52 or other feature in the heater chip 40, it is more preferable that the resistor 50 be located adjacent to an edge of the feature. If there is more than one feature, such as multiple ink vias 52 in a multi-color printhead, it is more preferable that the resistor 50 be located between each of the adjacent features and still be adjacent to at least one edge.

The resistor 50 length and width need to be of sufficient size to provide a measurable resistance value. Because the resistivity of most metals is low, the length of the resistor is usually much greater than its width.

To detect a fault in the heater chip, the resistance of the resistor must be measured at at least one temperature. Faults can be detected by measuring the resistance at ambient temperature and comparing that measurement to a known distribution of resistances at that temperature. This distribution can be calculated based on the average variations in geometry and material properties of a known group of resistors. For a given temperature, the theoretical calculated resistance will be:

$$R=\rho L/A \qquad \text{Equation 1}$$

wherein R is the resistance of a resistor, ρ is the resistivity of the material of the resistor (ohms-m), L is the length of the resistor and A is the cross sectional area of the resistor and is calculated as:

$$A=tw \qquad \text{Equation 2}$$

wherein t is the resistor thickness and w is the resistor width.

Because the resistivity is substantially constant and the length is typically much greater than the width, the distribution is substantially the result of variations in the resistor width and thickness.

The heater chip is considered not to have any defects if the measured resistance is not significantly less than or significantly greater than the theoretical calculated resistance. A significant difference will vary depending on how much the thickness and width vary along the length of a given resistor. The more variation that exists, the larger the difference between the measured electrical resistance and the theoretical calculated resistance must be to be considered significant. Conversely, if there is very little variation in width and thickness along the length of the resistor, a small difference may be considered significant. Typically, if the measured electrical resistance falls outside a predetermined range, such as for example +/−15% of the theoretical calculated resistance, the difference is considered significant and the heater chip is considered to have failed because it has an unacceptable level of faults.

A second embodiment of the method does not rely on comparison to a calculated average resistance, but rather compares a measured resistance or temperature change to a calculated resistance or temperature change for an individual resistor. The electrical resistance of each resistor can be calculated by the following equation 3:

$$R_2=R_1[1+\alpha(T_2-T_1)] \qquad \text{Equation 3}$$

wherein $R_2$ is the electrical resistance (ohms) at temperature $T_2$ (° C.), $R_1$ is the electrical resistance (ohms) at temperature $T_1$ (° C.), and α is the thermal resistivity coefficient of the resistor (° C.$^{-1}$).

Similarly, the temperature of the resistor can be calculated from the measured electrical resistance of the resistor by equation 4:

$$T_2=T_1+[R_2/R_1-1]/\alpha \qquad \text{Equation 4}$$

According to the second method, the resistance ($R_1$) of a chip is measured at a starting temperature ($T_1$). After heating the chip in a controlled manner by applying a fixed energy for a defined time to ink jet heaters, such as the high resistance resistor 48 or substrate heaters that are external to the heater chip 40, the electrical resistance ($R_2$) is measured. The expected temperature change is calculated as follows:

$$\text{Temp. Change}=[R_2/R_1-1]/\alpha \qquad \text{Equation 5}$$

The measured temperature change ($T_2-T_1$) is determined and compared to the expected calculated change. It is preferable to make ($T_2-T_1$) as large as possible to minimize the effects of heat control errors and resistance measurement errors. However, it is necessary to keep the temperature of the heater chip 40 within acceptable limits to prevent damage to the heater chip 40. More preferably, ($T_2-T_1$) is approximately 50° C. If the measured temperature change is significantly larger than or smaller than the expected temperature change, then the chip is considered to have faults. If the measured temperature change of the resistor is within an acceptable range defined by the distribution due to measurement error and heat control error of the expected calculated temperature change, then the chip is determined to have no defects. The magnitude of a significant difference can vary depending on the magnitude of measurement error and heat control error. A significant difference will be much larger if there is a greater magnitude of error introduced. Conversely, if there is very little measurement or heat control error, a significant difference will be much smaller. For example, the difference may be considered insignificant and the chip is considered to be fault free if the measured temperature change is within a predetermined range, such as for example, within +/−15% of the expected calculated temperature change.

Using the same equations, it is also possible to calculate the expected resistance ($R_2$) at temperature ($T_2$). The change in the measured resistance can then be compared to the change in the calculated resistance to determine whether the chip passes or fails.

Testing per the method of the present invention can be performed anytime after the resistor has been applied to the heater chip. Preferably, it is performed during the manufacturing cycle. It can be performed more than once, and in fact, it is preferable that the testing be performed more than once, as this can correct for any random false failures. To minimize the value added to a defective product, it is more preferable that the testing be performed before the printhead is completely assembled, for example after the heater chip has been mounted on the printhead assembly, but before the ink cartridge has been filled with foam and ink. In this way, the cost of final assembly can be avoided for a flawed printhead.

Following are examples of the methods of the present invention. These examples are presented for illustrative purposes only, and are not intended as a restriction on the scope of the invention.

EXAMPLE 1

For a given resistor, at room temperature, 25° C., the resistance is expected to fall within a known distribution of 300 +/−15% ohms. The resistance across the resistor is measured. If the resistance is greater than 345 ohms, i.e. 300+15%, the heater chip is cracked and the heater chip fails the inspection.

EXAMPLE 2

The resistance of a resistor 50 with a temperature coefficient of resistivity of 0.00347/° C. at room temperature, 25° C., is expected to fall within the range of 300 +/−15% ohms. The resistance across the resistor 50 is measured. If the measured resistance is greater than 345 ohms or less than 255 ohms, then the heater chip is cracked and the chip fails the inspection.

However, if the measured resistance of resistor 50 is within the 300 +/−15% ohms range, then the heater chip is heated to 75° C. by applying a known amount of energy to the high resistance resistor 48 on the heater chip 40.

If the measured resistance of resistor 50 at 75° C. is 350 ohms and is 300 ohms at 25° C., the chip is not defective:

$$\text{Calculated temperature change}=(350/300-1)/0.00347=48°\text{ C.}$$

The difference between the room temperature (25° C.) and the heated temperature (75° C.) is 50° C.

Because 48° C. is substantially equal to 50° C., the chip passes inspection.

However, if the measured resistance at 75° C. is 400 ohms, the chip is defective:

$$\text{Calculated temperature change}=(400/300-1)/0.00347=96°\text{ C.}$$

Because 96° C. is almost twice the measured temperature change, the chip does not pass inspection.

Although the invention has been described with respect to preferred embodiments, those skilled in the art will recognize that changes may be made in form and in detail without departing from the spirit and scope of the following claims.

What is claimed is:

1. A method for detecting at least one of a crack and a fracture in a printhead heater chip, comprising the steps of:

a. forming said printhead heater chip such that a resistor is adjacent to at least one edge of said chip to sense said at least one of a crack and a fracture in said printhead heater chip;

b. measuring the electrical resistance of said resistor at a first temperature; and, c. comparing said measured electrical resistance to a theoretical calculated resistance, wherein a result of the comparing step represents the absence or presence of said at least one of a crack and a fracture in said printhead heater chip.

2. The method of claim 1, wherein if said measured electrical resistance is not substantially equal to said theoretical calculated resistance, the heater chip is considered faulty, and if said measured electrical resistance is substantially equal to the theoretical calculated resistance, the heater chip is considered to be substantially free of faults.

3. The method of claim 1, wherein if said measured electrical resistance is significantly greater than or significantly less than said theoretical resistance, the heater chip is considered faulty.

4. A method according to claim 1, further comprising the steps of:

a. heating said chip to a second temperature;

b. measuring the second electrical resistance of said resistor at said second temperature; and, c. comparing said second measured electrical resistance to a second theoretical calculated resistance.

5. The method of claim 4, wherein if said second measured electrical resistance is not substantially equal to said second theoretical calculated resistance, said heater chip is considered faulty, and if said second measured electrical resistance is substantially equal to the second theoretical calculated resistance, said heater chip is considered substantially free of faults.

6. The method of claim 4, wherein if said second measured electrical resistance is significantly greater than or significantly less than said second theoretical calculated resistance, said heater chip is considered faulty.

7. A method according to claim 1, wherein said resistor is adjacent to an outside perimeter of said heater chip.

8. A method according to claim 1, wherein said heater chip has an ink via and said resistor is adjacent to an edge of said ink via.

9. A method according to claim 1, wherein said heater chip has more than one ink via and said resistor is located between adjacent ink vias.

10. A method according to claim 1, wherein if said measured electrical resistance is within +/−15% of said theoretical calculated resistance, said heater chip is substantially free of faults, and wherein if said measured resistance is not within +/−15% of said theoretical calculated resistance, said heater chip has faults.

* * * * *